(12) United States Patent
Yoon et al.

(10) Patent No.: US 7,932,663 B2
(45) Date of Patent: Apr. 26, 2011

(54) PIEZOELECTRIC TRANSFORMER WITH PINWHEEL TYPE ELECTRODE

(75) Inventors: Tae-Shik Yoon, Seoul (KR); Man-Sun Yun, Cheongju (KR)

(73) Assignees: Inova Inc., Chungbuk (KR); Santoma Ltd., Kowloon (HK)

( * ) Notice: Subject to any disclaimer, the term of this patent is extended or adjusted under 35 U.S.C. 154(b) by 0 days.

(21) Appl. No.: 12/450,766

(22) PCT Filed: Apr. 11, 2007

(86) PCT No.: PCT/KR2007/001765
§ 371 (c)(1),
(2), (4) Date: Jan. 13, 2010

(87) PCT Pub. No.: WO2008/126947
PCT Pub. Date: Oct. 23, 2008

(65) Prior Publication Data
US 2010/0109487 A1    May 6, 2010

(51) Int. Cl.
*H01L 41/107* (2006.01)
(52) U.S. Cl. .......................... 310/359; 310/366; 310/369

(58) Field of Classification Search ................... 310/359, 310/366, 367, 369
See application file for complete search history.

(56) References Cited

U.S. PATENT DOCUMENTS

| | | | | |
|---|---|---|---|---|
| 2,945,984 A * | 7/1960 | Yando | ............................. | 315/55 |
| 3,114,849 A * | 12/1963 | Poschenrieder | .............. | 310/330 |
| 5,861,704 A * | 1/1999 | Kitami et al. | ................. | 310/369 |
| 7,038,358 B2 * | 5/2006 | Bryant et al. | ................. | 310/365 |

* cited by examiner

*Primary Examiner* — Thomas M Dougherty
(74) *Attorney, Agent, or Firm* — Rosenberg, Klein & Lee

(57) ABSTRACT

Disclosed herein is a piezoelectric transformer having a pinwheel-type electrode. The piezoelectric transformer of the present invention includes a body, an upper electrodes and a lower electrode. The body is formed in a circular planar shape and is made of a piezoelectric material. The upper electrodes are formed to be adjacent to one of first and second planes corresponding to upper and lower surfaces of the body, formed in the same planar shape as that of the body, and formed to be separated in the shape of a pinwheel. In the upper electrodes, input voltage is applied to some of separate electrodes, and output voltage is obtained from the remaining electrodes. The lower electrode is adjacent to a plane opposite the plane on which the upper electrode is formed, the lower electrode being formed in the same planar shape as that of the body.

12 Claims, 19 Drawing Sheets

(a)

(b)

——— : Stress
- - - - : Displacement (a)   (b)

(a)

(b)

(a)

(b)

(a)

(b)

(a)

(b)

(a)

(b)

PIEZOELECTRIC TRANSFORMER WITH PINWHEEL TYPE ELECTRODE

TECHNICAL FIELD

The present invention relates, in general, to a piezoelectric transformer for amplifying voltage using the piezoelectric effect and reverse piezoelectric effect of a piezoelectric material and, more particularly, to a high efficiency piezoelectric transformer, which can obtain high output characteristics by effectively generating torsional vibration using a new electrode structure and a new arrangement of polarization directions.

BACKGROUND ART

Generally, research on piezoelectric transformers is based on practical research conducted by C. E. Rosen, et al. in GE in the U.S. in 1957. Since the piezoelectric material used at that time was barium titanate, having a boosting range of 50 to 60 times under no-load conditions, there is the limitation of utilization of the piezoelectric transformer. However, a new piezoelectric material using $Pb(Zr,Ti)O_3$ as a principal component is discovered, so that boosting over a wider range becomes possible, and thus research on the practical use of the piezoelectric transformer has recently been conducted in earnest.

When a conventional winding type transformer is compared to a piezoelectric transformer, the winding type transformer takes a boosting method based on electromagnetic induction, but the piezoelectric transformer uses piezoelectric and reverse piezoelectric effects, and thus causes less electromagnetic noise. Further, the boosting ratio is determined by a winding ratio in the case of the winding type transformer, but is determined by the characteristics of the material and the structure and dimensions of an electrode in the case of the piezoelectric transformer.

Further, from the standpoint of output power, since the winding ratio must be increased to transform the voltage and current of a secondary side into high voltage and low current in the case of the winding type transformer, a leakage component increases in proportion to the increase in the winding ratio. The piezoelectric transformer using a piezoelectric material exploits electrical-mechanical (primary side)-mechanical-electrical (secondary side) combination, and thus there is an advantage in that 90% or more efficiency can be realized.

Such a transformer, having high voltage and low current on the secondary side, can satisfactorily realize impedance matching when a load has high impedance, so that efficiency is improved, thus obtaining excellent load characteristics and increasing energy conversion efficiency.

The implementation of a piezoelectric transformer having high voltage and low current characteristics is still performed very satisfactorily, and the application of the piezoelectric transformer to the inverter for the backlight of a notebook computer, to which the piezoelectric transformer can be applied, has been positively considered.

Recent notebook computers have a trend toward small size and thinness, but a conventional winding type transformer is limited in usefulness when realizing small size and thinness due to the obtainment of insulation and resisting voltage, and decreases efficiency due to winding loss, such as core loss. In order to overcome such a disadvantage, if a piezoelectric transformer is applied to the LCD backlight of a notebook computer, impedance matching between the piezoelectric transformer and the LCD backlight of the notebook computer is satisfactorily performed, so that there is no problem in the application of the piezoelectric transformer to the backlight inverter of the notebook computer, and some products to which the piezoelectric transformer is applied have already been marketed.

Meanwhile, research on high output power, such as in a primary Rosen type and a tertiary Rosen type, has recently been actively conducted, and research on a layering method for parallel operation has been conducted therewith.

The problem of the basic structure of a conventional piezoelectric transformer is described with reference to FIG. 1. As shown in FIG. 1, various types of structures have been proposed as the basic structure of a piezoelectric transformer, but the structure of FIG. 1(a), having a rectangular planar shape, is evaluated as the most useful structure, from the standpoint of a manufacturing process and a boosting ratio.

As shown in FIG. 1, half of a planar piezoelectric element has an electrode formed in a thicknesswise direction and has a polarization direction also formed in the thicknesswise direction. The remaining half thereof has an electrode formed in a lengthwise direction and has a polarization direction also formed in the lengthwise direction.

In this case, the electrode part formed in the thicknesswise direction is designated as a driving unit, and the electrode part formed in the lengthwise direction is designated as an output unit. They correspond to the primary side and secondary side of the transformer, respectively.

When the input voltage of an inherent resonant frequency, determined to be 2L, which is a longitudinal dimension, is applied to the driving unit (thicknesswise electrode part), strong mechanical vibrations occur due to the electrostrictive effect, so that charges are generated because of the piezoelectric effect, occurring in the output unit (lengthwise electrode part) due to such mechanical vibrations, and high AC voltage can be obtained at an output terminal.

That is, a boosting operation is performed using transformation from electrical energy to mechanical energy or from mechanical energy to electrical energy.

FIG. 2 illustrates the distribution of displacement and stress in respective vibration modes.

In FIG. 2, the point at which displacement is 0 and stress is maximized is called a node point, and the maximal boosting ratio can be obtained only when the node point is supported.

The greatest disadvantage of this structure is in that, since the polarization directions of the driving unit and the output unit are orthogonal, the concentration of stress on a boundary surface becomes serious, in that, since a high electric field of 3 kV/mm is applied when the output unit is polarized, the implementation of polarization is difficult, and in that, since the electrode area of the output terminal is small, it is difficult to obtain high current, and thus high voltage and low current output characteristics are obtained. Accordingly, such a structure is not suitable for high current lighting, such as in a fluorescent lamp.

In order to solve this problem, a method of independently manufacturing a plurality of piezoelectric elements and driving the piezoelectric elements in parallel has been proposed. However, this method is problematic in that, since it is difficult to control the precise dimension of electrodes, resonant frequencies cannot be identical to each other, and since the disadvantage of the polarization process is not overcome, output characteristics are deteriorated.

DISCLOSURE

Technical Problem

Accordingly, the present invention has been made keeping in mind the above problems occurring in the prior art, and an object of the present invention is to provide a piezoelectric transformer, which can obtain high output characteristics (high voltage and high current) using a new electrode structure and a new arrangement of polarization directions, which are different from those of a conventional piezoelectric transformer.

Another object of the present invention is to provide a high efficiency piezoelectric transformer, which can stably light an External Electrode Fluorescent Lamp (EEFL), a fluorescent lamp, and a three-wave lamp, which require high voltage and high current, at a home input voltage of 220V/110V, without using a winding type transformer in a drive circuit.

ADVANTAGEOUS EFFECTS

As described above, the present invention is advantageous in that it can obtain high voltage and high current output by utilizing torsional vibration obtained from a pinwheel-type electrode structure, and in that a driving unit and an output unit are polarized in the same direction, thus guaranteeing durability and productivity.

Further, the present invention is advantageous in that it enables the lighting of a typical fluorescent lamp and EEFL for home-use, which could not be lit by a conventional transformer at a commercial voltage.

BEST MODE

Figure 1:
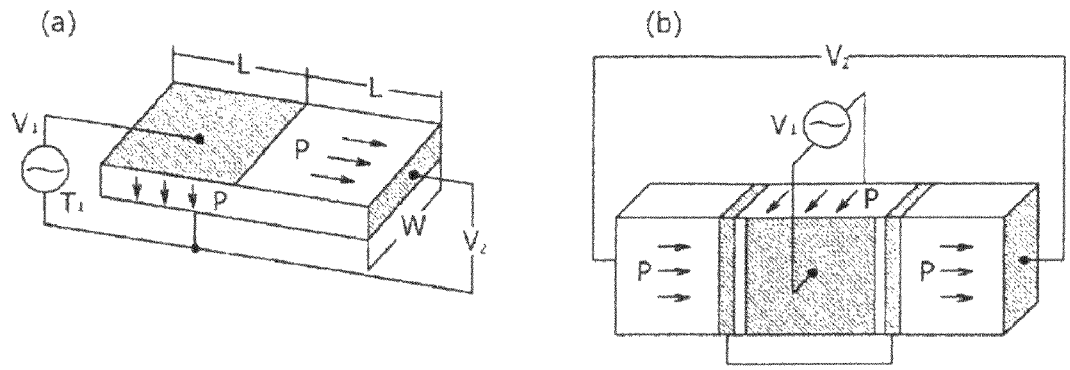
FIG. 1 is a view showing the structure of a conventional piezoelectric transformer.
Figure 2:
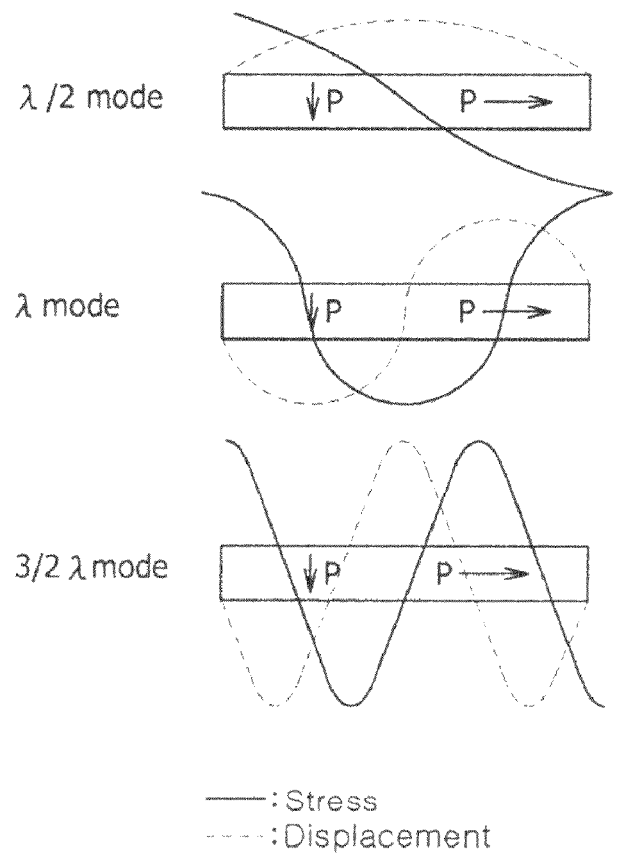
FIG. 2 is a view showing the stress-displacement distribution of a primary Rosen type piezoelectric transformer in vibration modes.

In order to accomplish the above objects, the present invention provides a piezoelectric transformer, comprising a body made of a piezoelectric material, upper electrodes formed on one surface of the body, and a lower electrode formed on the opposite surface of the body. The upper electrodes are formed in a planar shape, identical to that of the body, and are formed to be separated in the shape of a pinwheel, the upper electrodes being implemented such that an input voltage is applied to some of separate electrodes, and an output voltage is obtained from the remaining electrodes. In an embodiment, the lower electrodes are formed in a planar shape, which is identical to that of the body and are implemented using an input/output common electrode. In another embodiment, the lower electrodes are formed in a planar shape, which is identical to that of the body, and is formed to be separated in the shape of a pinwheel so that the lower electrodes are formed to be rotated at a predetermined angle with respect to the upper electrodes, the lower electrodes being implemented such that an input voltage is applied to those electrodes corresponding to the some of the upper electrodes, to which the input voltage is applied, and output voltage is obtained from the remaining electrodes.

In an embodiment of the present invention, the upper electrodes may comprise a plurality of spiral wing-shaped electrodes, and an electrode formed in a portion other than the plurality of wing-shaped electrodes, the wing-shaped electrodes forming the pinwheel shape while being spaced apart from each other at regular intervals. The input voltage may be applied to the electrode other than the wing-shaped electrodes, among the separate electrodes of the upper electrode, and the output voltage may be obtained from the plurality of wing-shaped electrodes, and vice versa.

In another embodiment, the upper electrodes may be separated by a plurality of spiral insulating lines which radially outwardly extend spirally from an insulating region formed at the center of the upper electrodes, thus forming the pinwheel shape.

Preferably, the body may have a polarization direction formed in a thicknesswise direction. Preferably, the pinwheel shape formed on the upper electrodes may have a shape that rotates counterclockwise or clockwise. The body may include planes that are each formed in a circular shape or a ring shape.

Hereinafter, embodiments of the present invention will be described in detail with reference to the attached drawings. Reference now should be made to the drawings, in which the same reference numerals are used throughout the different drawings to designate the same or similar components. In the following description of the present invention, detailed descriptions may be omitted if it is determined that the detailed descriptions of related well-known functions and construction may make the gist of the present invention unclear.

Figure 3:
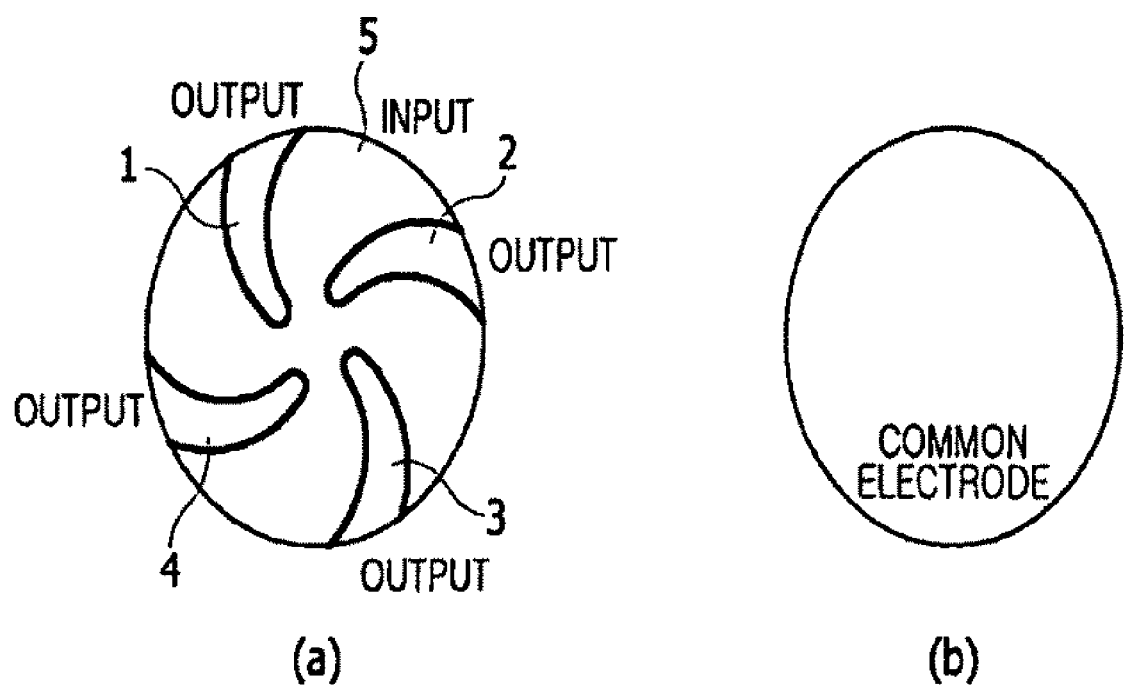
FIG. 3 is a view showing the shapes of the electrodes of a piezoelectric transformer according to an embodiment of the present invention.

FIG. 3 is a view showing the shapes of the electrodes of a piezoelectric transformer according to an embodiment of the present invention. FIG. 3(a) illustrates the upper electrode of the piezoelectric transformer and FIG. 3(b) illustrates the lower electrode of the piezoelectric transformer.

In the embodiment of FIG. 3, the upper electrodes are formed on the upper surface (first plane) of a coin-shaped body made of a piezoelectric material, and the lower electrode is formed on the lower surface (second plane) of the body. The upper electrodes (FIG. 3(a)) are implemented such that an input electrode 5 and four wing-shaped output electrodes 1, 2, 3, and 4 form the shape of a pinwheel. The lower electrode (FIG. 3(b)) is implemented using an input/output common electrode, having the same shape as the planar shape (circular plate) of the body.

The output electrodes of FIG. 3(a) include four spiral wing-shaped electrodes 1, 2, 3 and 4, each having a tip around the center of the circular plate, and respective wing shapes are separated to form the shape of a pinwheel, respective wings of which are spaced apart from each other at predetermined intervals. The pinwheel is formed in a shape which is rotated clockwise or counterclockwise.

In FIG. 3(a), the upper electrodes are implemented such that input voltage is applied to the input electrode 5, other than the output electrodes 1, 2, 3 and 4, among the separate electrodes of the upper electrodes, and output voltage is obtained from the output electrodes 1, 2, 3 and 4.

In FIG. 3(b), the lower electrode is formed as a single body, without being separated, and is connected to a common ground.

Figure 9:
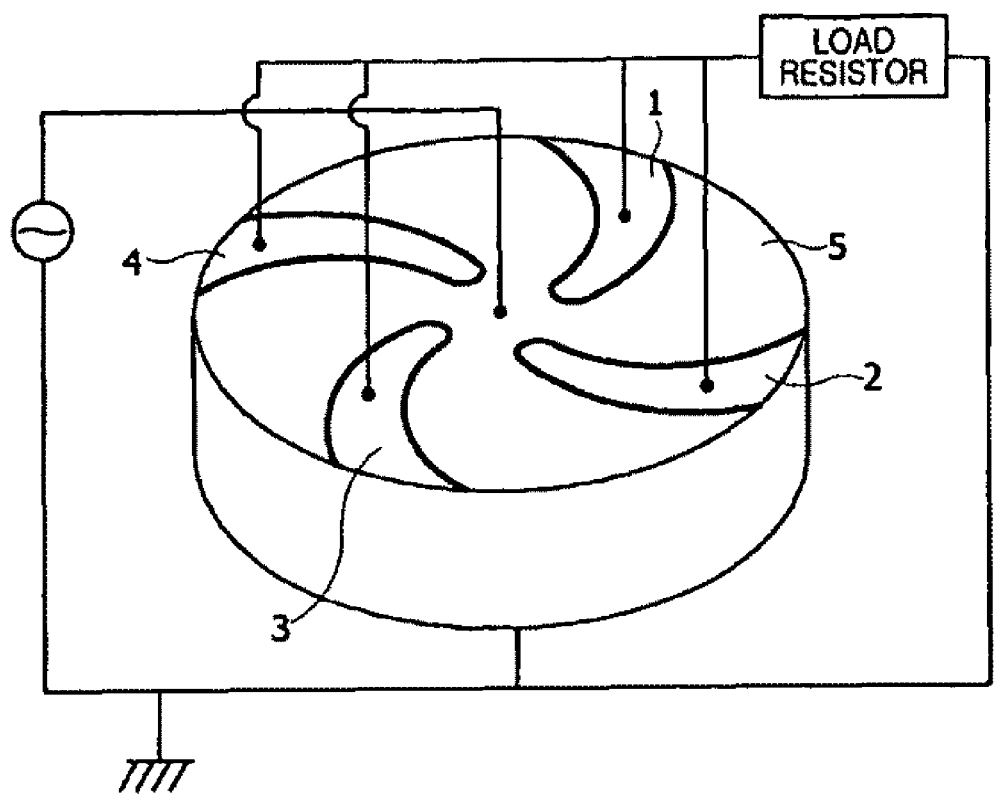
FIG. 9 is a view showing a method of driving a piezoelectric transformer according to an embodiment of the present invention.

An example of the driving of the piezoelectric transformer according to the embodiment of FIG. 3 is shown in FIG. 9.

In FIG. 3, a method of connecting the input voltage and the output voltage is only an embodiment, and it is apparent that the piezoelectric transformer can be driven by connecting the input voltage and the output voltage using other methods. For example, it is possible that input voltage is applied to the wing-shaped electrodes 1, 2, 3 and 4, among the separate electrodes of the upper electrodes, and output voltage is obtained from the electrode 5 other than the wing-shaped electrodes.

Figure 4:
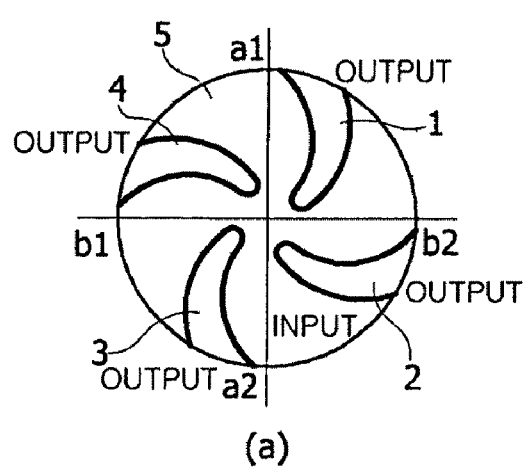
FIG. 4 is a view showing the shapes of the electrodes of a piezoelectric transformer according to another embodiment of the present invention.
Figure 4:
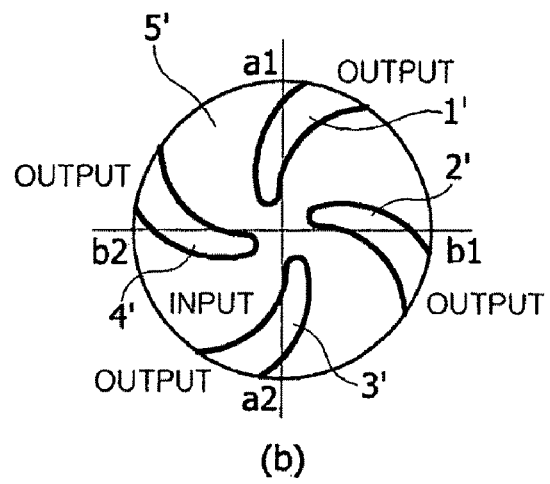

FIG. 4 is a view showing the shapes of the electrodes of a piezoelectric transformer according to another embodiment of the present invention. FIG. 4(a) illustrates the upper electrodes of the piezoelectric transformer, and FIG. 4(b) illustrates the lower electrodes of the piezoelectric transformer.

In the embodiment of FIG. 4, the upper electrodes are formed on the upper surface (first plane) of a coin-shaped body made of a piezoelectric material, and the lower electrodes are formed on the lower surface (second plane) of the body. The upper electrodes (FIG. 4(a)) are composed of an input electrode 5 and four wing-shaped output electrodes 1, 2, 3, and 4, and the input electrode and the output electrodes are separated from each other by insulating lines (indicated by black lines). The lower electrodes (FIG. 4 (b)) is formed on the surface having the same shape as the planar shape (circle) of the body, and are separated in the shape of a pinwheel, the same as the upper electrodes, but are formed to be rotated at a predetermined angle with respect to the upper electrode.

In FIG. 4(a), the upper electrodes are composed of a plurality of wing-shaped electrodes 1, 2, 3 and 4, each having a tip around the center of the upper electrode, and respective wing-shaped electrodes are separated to form the shape of a pinwheel, respective wings of which are spaced apart from each other at predetermined intervals. The pinwheel is formed in a shape which is rotated clockwise or counterclockwise.

In FIG. 4(a), the upper electrodes are implemented such that input voltage is applied to the electrode 5, other than the wing-shaped electrodes 1, 2, 3 and 4, among the separate electrodes of the upper electrodes, and output voltage is obtained from the wing-shaped electrodes 1, 2, 3 and 4.

In FIG. 4(b), the lower electrodes are implemented such that input voltage is applied to an electrode 5', other than wing-shaped electrodes 1', 2', 3' and 4', among the separate electrodes of the lower electrodes, and output voltage is obtained from the wing-shaped electrodes 1', 2', 3' and 4'.

Figure 10:
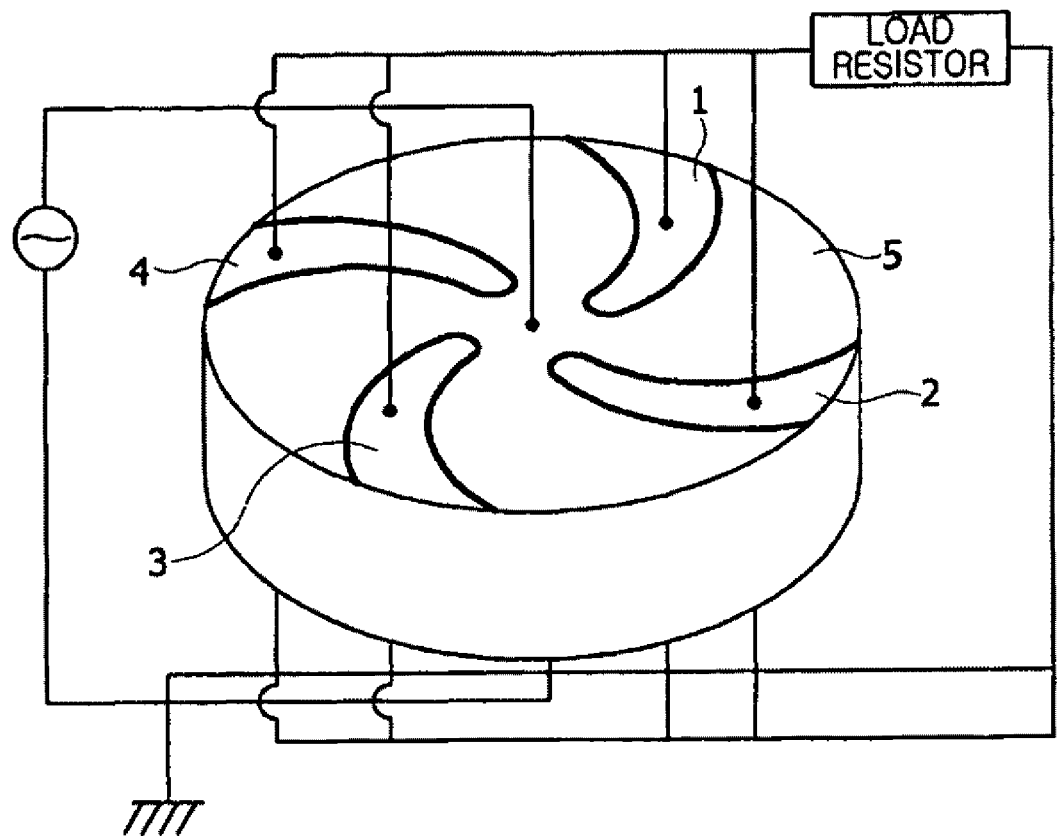
FIG. 10 is a view showing a method of driving a piezoelectric transformer according to another embodiment of the present invention.

An example of the driving of the piezoelectric transformer according to the embodiment of FIG. 4 is shown in FIG. 10.

In FIG. 4, a method of connecting the input voltage and the output voltage is only an embodiment, and it will be apparent that the piezoelectric transformer can be driven by connecting the input voltage and the output voltage using other methods. For example, the piezoelectric transformer can be driven in such a way that input voltage is applied to the wing-shaped electrodes 1, 2, 3 and 4, among the separate electrodes of the upper electrodes, and output voltage is obtained from the electrode 5 other than the wing-shaped electrodes, and that the input and output voltages of the lower electrodes can be connected to correspond to those of the upper electrodes.

Other embodiments of the present invention may include embodiments comprising electrodes having shapes that are different from those of the electrodes of FIGS. 3 and 4.

Figure 5:
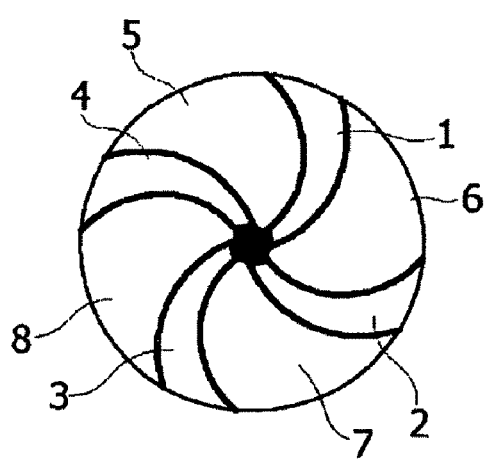
FIG. 5 is a view showing the shapes of the electrodes of a piezoelectric transformer according to a further embodiment of the present invention.
Figure 5:
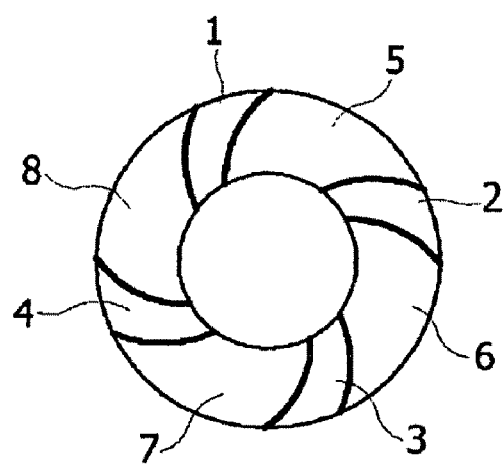

FIG. 5 is a diagram showing the shapes of the electrodes of a piezoelectric transformer according to a further embodiment of the present invention. FIG. 5(a) illustrates an embodiment in which all of the input and output electrodes are separated from each other, and FIG. 5(b) illustrates an embodiment of a ring-shaped piezoelectric transformer.

In FIG. 5(a), it can be seen that upper electrodes are separated by a plurality of spiral insulating lines which radially outwardly extend spirally from an insulating region (indicated by a black circle) formed at the center of the upper electrodes, and is thus formed in the shape of a pinwheel. Respective electrodes are separated by the insulating region and the insulating lines.

FIG. 5(b) illustrates an embodiment of the ring-shaped piezoelectric transformer, which includes a ring-shaped planar body made of a piezoelectric material, and upper electrodes, which are formed to be adjacent to one of the first and second planes, corresponding to the upper and lower surfaces of the body, are formed in the same planar shape as the body, and are formed to be separated in the shape of a pinwheel.

In FIG. 5, the lower electrode(s) may be formed as a common ground electrode, as shown in FIG. 3(b), or may be formed to be separated in the shape of a pinwheel, as in the case of the upper electrodes, and to be rotated at a predetermined angle with respect to the upper electrodes.

In FIG. 5, a driving unit can be connected such that input voltage is applied to some of the separate electrodes, and output voltage is obtained from the remaining electrodes. For example, input voltage can be connected to the electrodes 1, 2, 3, and 4, and output voltage can be obtained from the remaining electrodes 5, 6, 7, and 8. Of course, the opposite case is also possible, and the piezoelectric transformer can be driven by connecting input voltage and output voltage using various methods, according to the embodiments.

Figure 6:
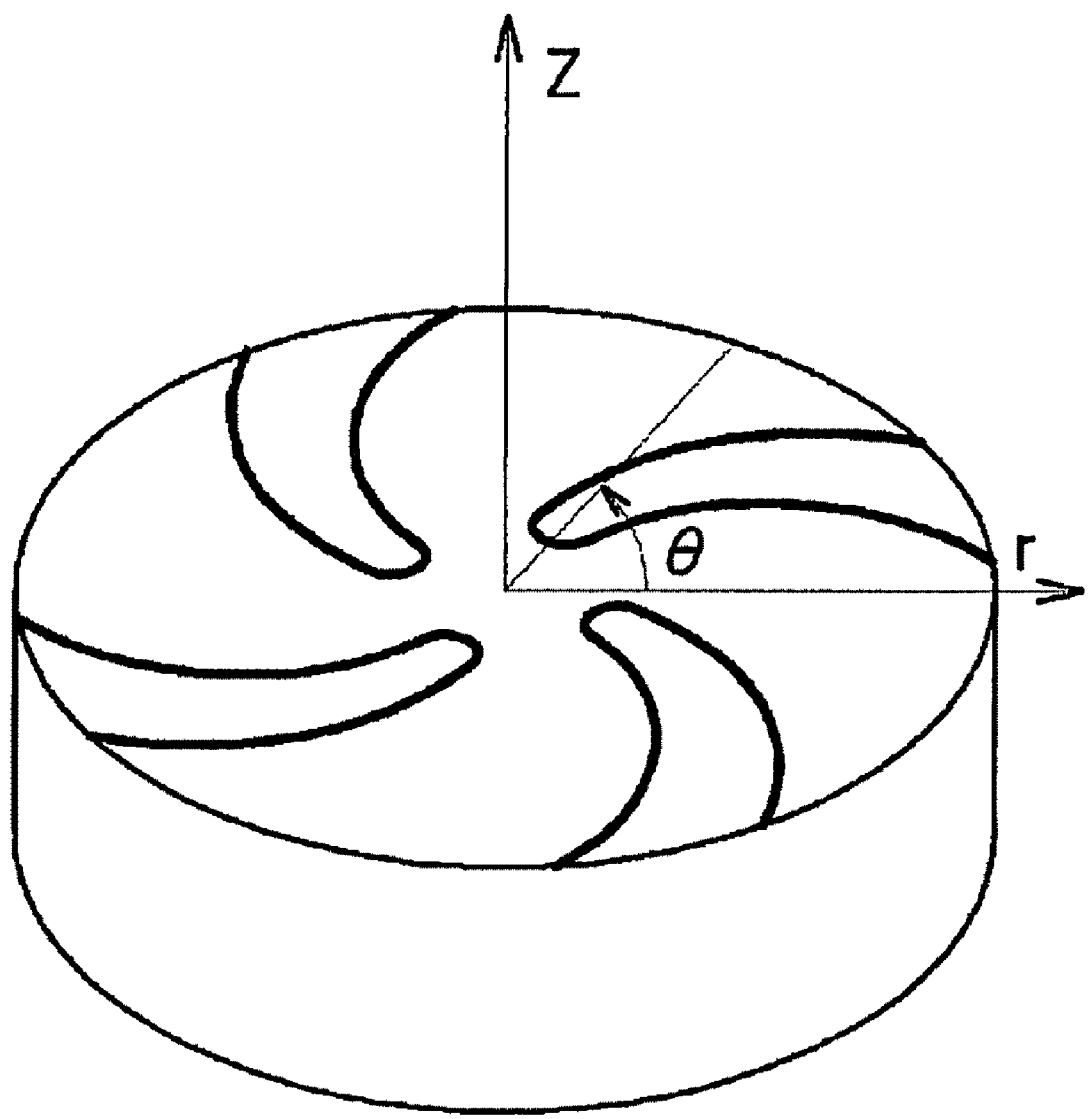
FIG. 6 is a view showing a coordinate system for describing torsional vibration according to an embodiment of the present invention.

FIG. 6 is a view showing a coordinate system for describing torsional vibration according to an embodiment of the present invention. The coordinate system of FIG. 6 is a polar coordinate system, and it can be seen that electrodes having shapes rotating clockwise around the origin of the coordinate system are formed. It is also possible to implement an embodiment in which electrodes having shapes rotating counterclockwise around the origin of the coordinate system are formed, as the opposite case of the embodiment of FIG. 6.

Figure 7:
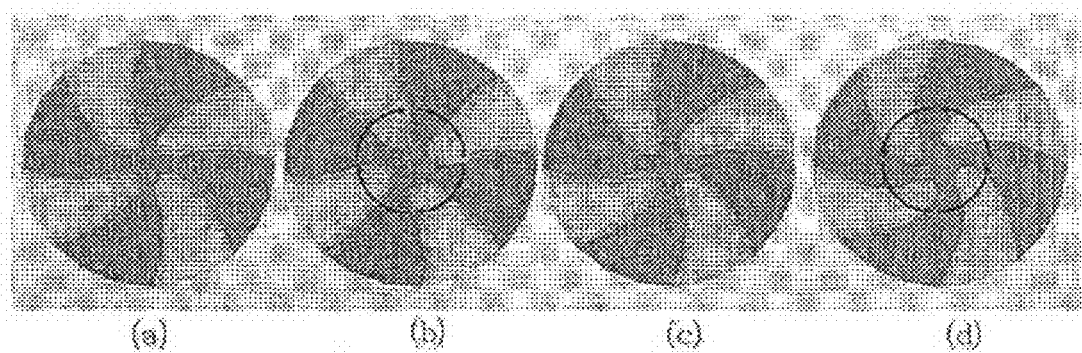
FIGS. 7 and 8 are views showing the shape of torsional vibration at a resonant frequency according to an embodiment of the present invention.
Figure 8:
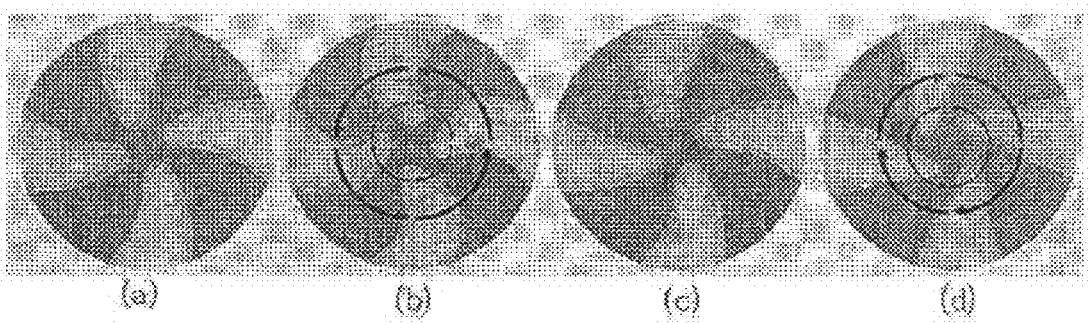

FIGS. 7 and 8 are views showing the shapes of torsional vibration at a resonant frequency according to an embodiment of the present invention, which shows the results of simulation of displacement in respective vibration modes. In FIGS. 7 and 8, it can be seen that torsional vibration occurs in the sequence of (a)→(b)→(c)→(d)→(a), . . . , wherein an arrow indicates the displacement direction of vibration. The results of (a) and (c) illustrate a neutral state, and results of (b) and (d) illustrate the state of maximum displacement. Such torsional vibration occurs due to the pinwheel-type electrode structure, as described above.

Figure 11:
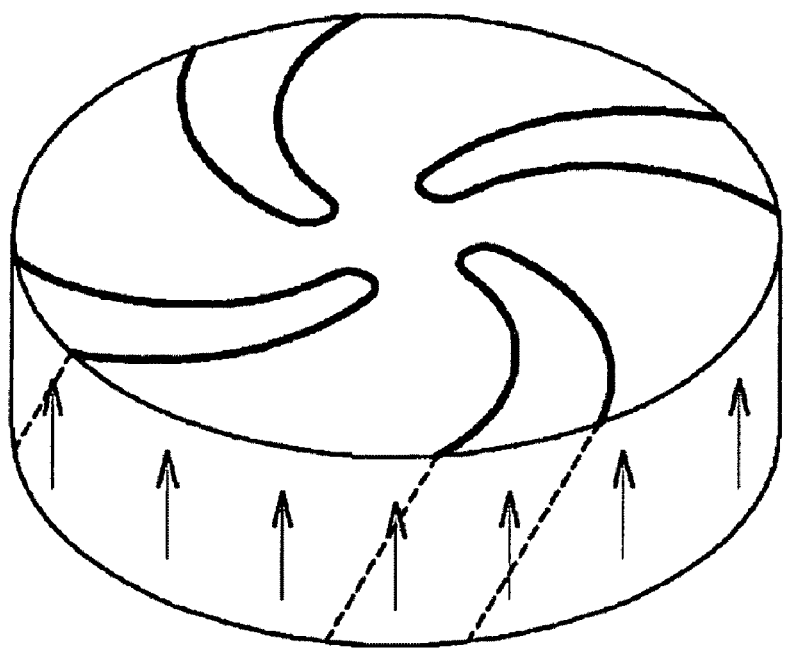
FIG. 11 is a view showing the polarization direction of a piezoelectric transformer according to an embodiment of the present invention.

FIG. 11 is a view showing the polarization direction of a piezoelectric transformer according to an embodiment of the present invention. As shown in FIG. 11, the polarization direction of a body is formed in a thicknesswise direction. In order to indicate that upper electrodes and lower electrodes are rotated at a predetermined angle, FIG. 11 shows the state in which the ends of the wings of the upper electrodes are connected to the ends of corresponding wings of the lower electrodes through dotted lines. As shown in FIG. 11, the lower electrodes are preferably formed to be rotated at a predetermined angle with respect to the upper electrodes.

Figure 12:
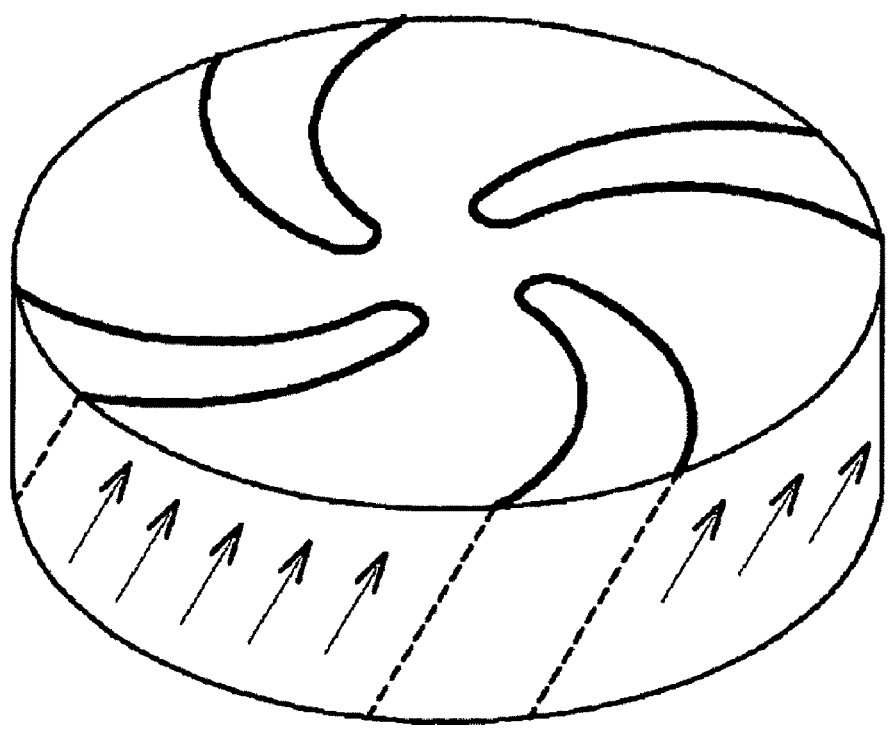
FIG. 12 is a view showing the electric field direction of a piezoelectric transformer according to an embodiment of the present invention.

FIG. 12 is a view showing the electric field direction of a piezoelectric transformer according to an embodiment of the present invention. FIG. 12 illustrates the direction of an electric field formed on the input side of the electrode structure of FIG. 3. In FIG. 12, the state in which the lower electrodes are formed to be rotated at a predetermined angle with respect to the upper electrodes is indicated on the side of the electrode structure using dotted lines.

Figure 13:
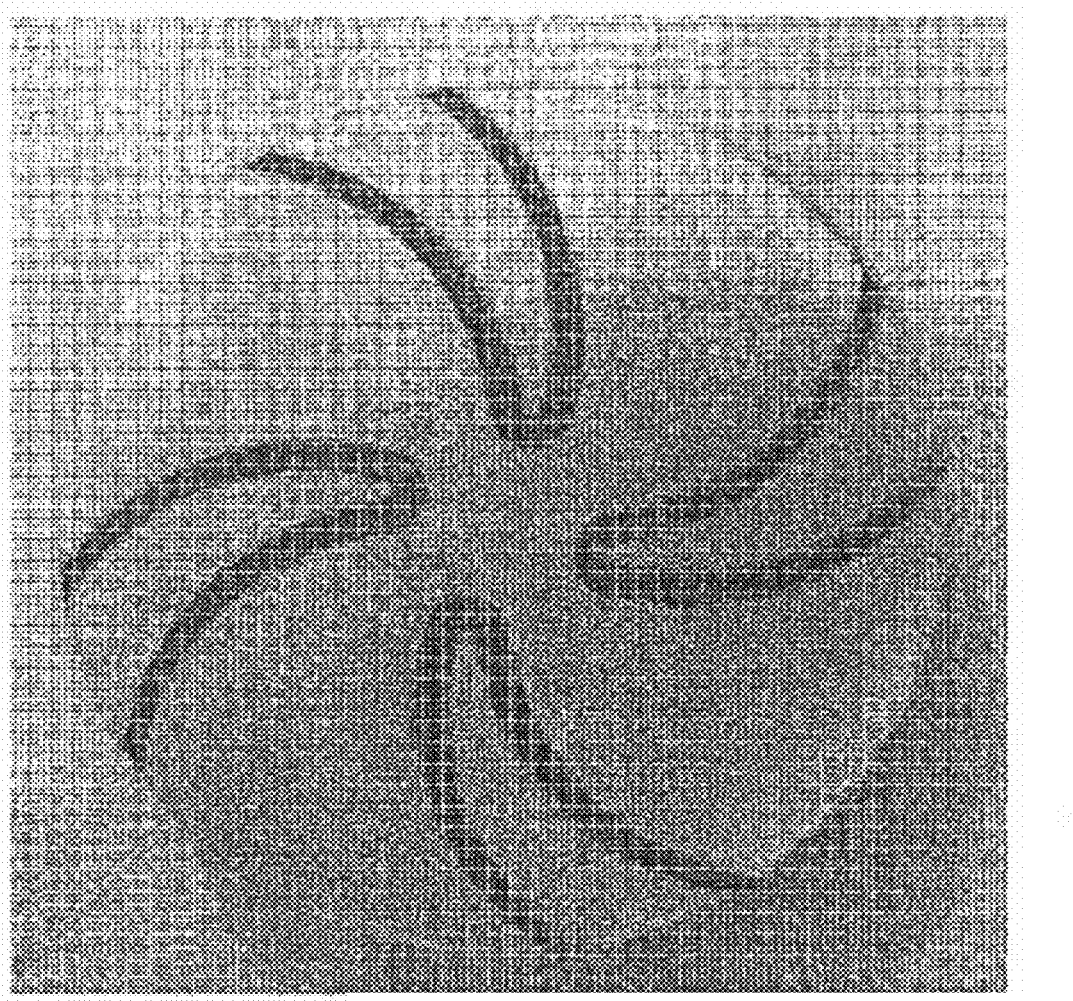
FIG. 13 is a view showing the actual picture of a piezoelectric transformer according to an embodiment of the present invention.

FIG. 13 is a view showing an actual photograph of a piezoelectric transformer according to an embodiment of the present invention, which is actually used in the experiment of the present invention.

Figure 14:
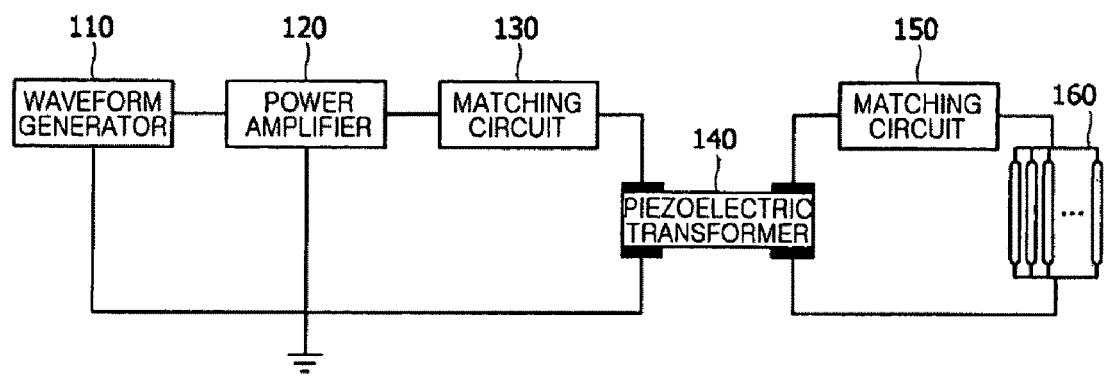
FIG. 14 is a block diagram showing the construction of a system using a piezoelectric transformer according to a first embodiment of the present invention.

FIG. 14 is a block diagram showing the construction of a system using the piezoelectric transformer according to an embodiment of the present invention. The system of FIG. 14 includes a waveform generator 110, a power amplifier 120, an input side matching circuit 130, a piezoelectric transformer 140, an output side matching circuit 150, and EEFLs 160. In the embodiment of FIG. 14, a sine wave having an input voltage range from 0 to 130 Vrms is used in a driving unit, and an input frequency, which is used in a maximum output mode, is used.

Further, the piezoelectric and dielectric characteristics of the ceramic piezoelectric element used in this experiment are described below.

<Piezoelectric and Dielectric Characteristics of Element for Piezoelectric Transformer>

Compositional formula $Pb(Mn_{1/3}Nb_{2/3})$-PZT+additive
Longitudinal piezoelectric constant ($d_{31}$) −150 pC/N
Longitudinal electrical-mechanical coupling coefficient (kp) 0.6
Permittivity 1200
Tan δ 0.25
Qm 2200
Tc 310° C.

In FIG. 14, a piezoelectric transformer having the electrode structure of FIG. 4 is used. The interval between electrodes is 1.5 mm, the diameter of the electrode structure is 28 mm, and the thickness of the electrode structure is 5 mm. For impedance matching on a primary side, an inductor having an inductance of 2.4 mH is used. 10 EEFLs having an output power of 6 W are driven in parallel as a load resistor. For impedance matching on the load side, an inductor having an inductance of 8 mH is used.

Figure 15:
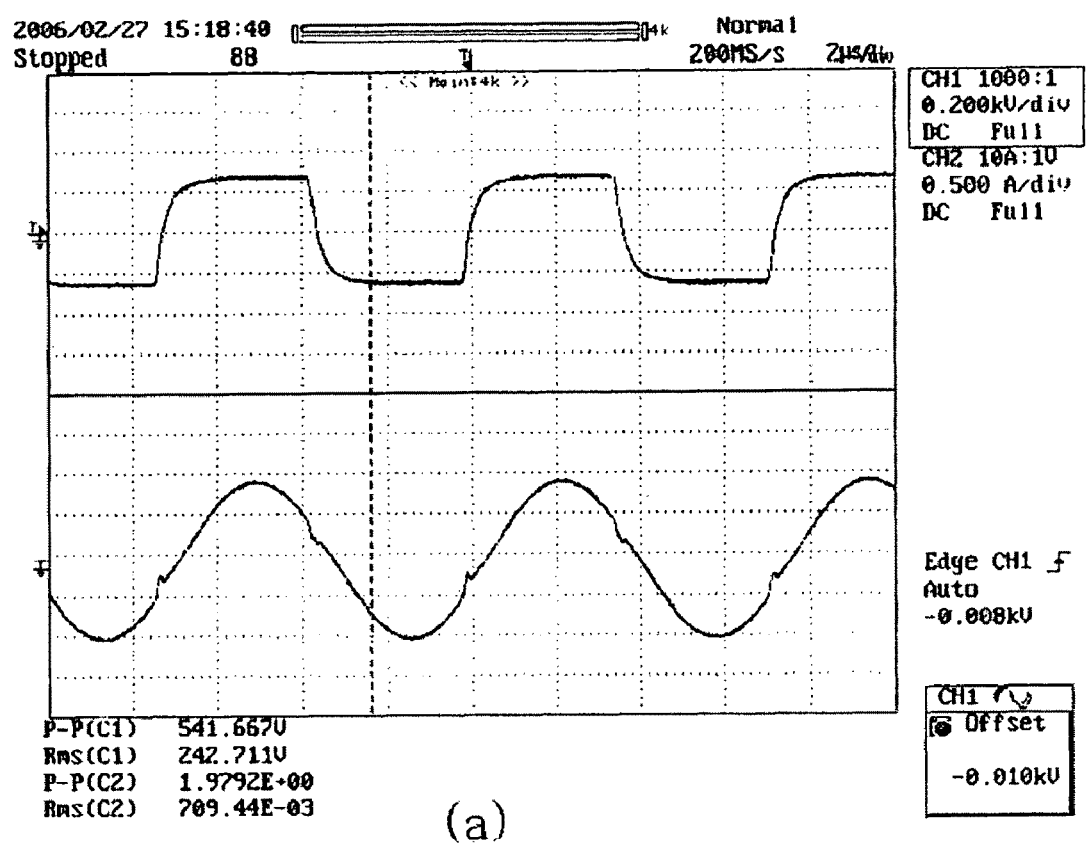
FIG. 15 illustrates graphs showing voltages and currents on input and output sides, obtained in an experiment according to a first embodiment of the present invention.
Figure 15:
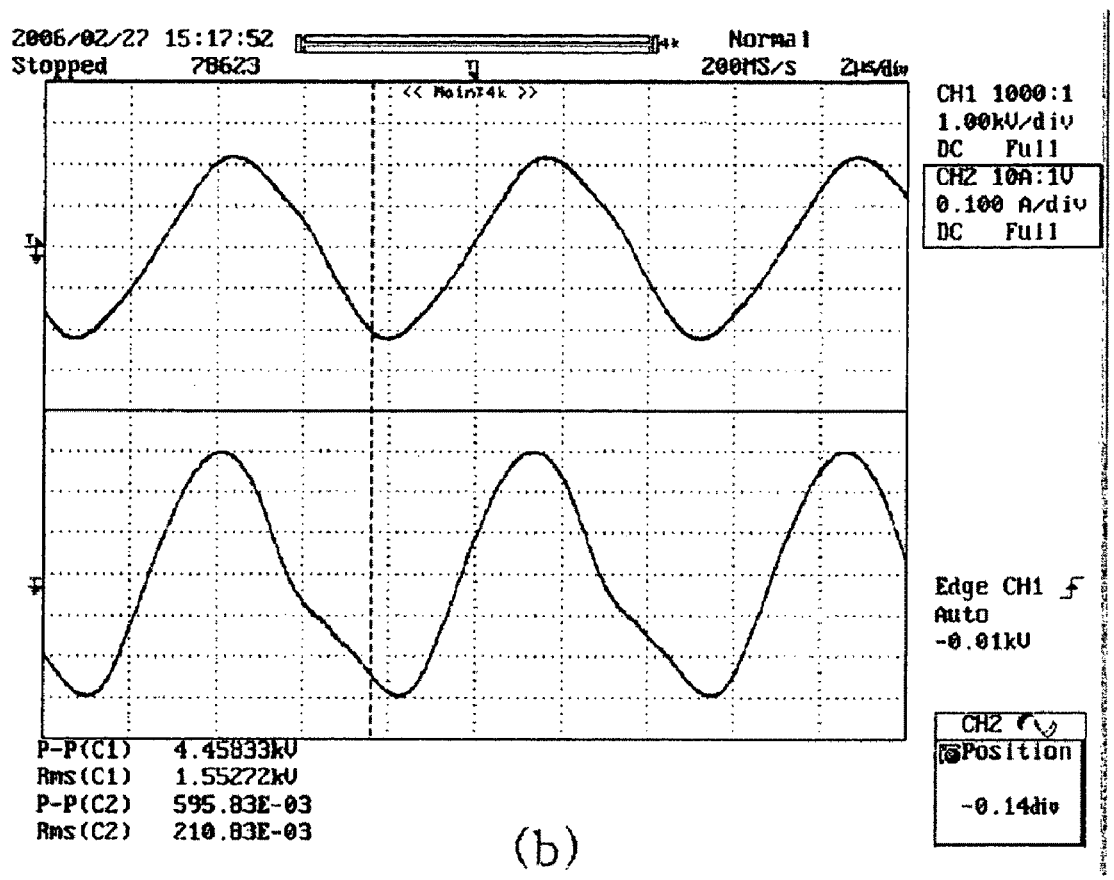

FIG. 15 illustrates graphs of voltages and currents on an input side and an output side in an experiment according to a first embodiment of the present invention. FIG. 15(a) illustrates waveforms of voltage and current on the input side, and FIG. 15(b) illustrates waveforms of voltage and current on the output side. In the graphs of FIG. 15, it should be noted that, in the case of a voltage waveform, a measured value must be read as a value obtained by multiplying 0.5 by the measured value, because the scale of a voltage probe is 500:1 and the scale of an oscilloscope is 1000:1. For example, a measured Root Mean Square (RMS) input side voltage is 206.2 Vrms, but an actual voltage value is 103.1 Vrms, which is obtained by multiplying 0.5 by 206.2 Vrms.

Figure 16:
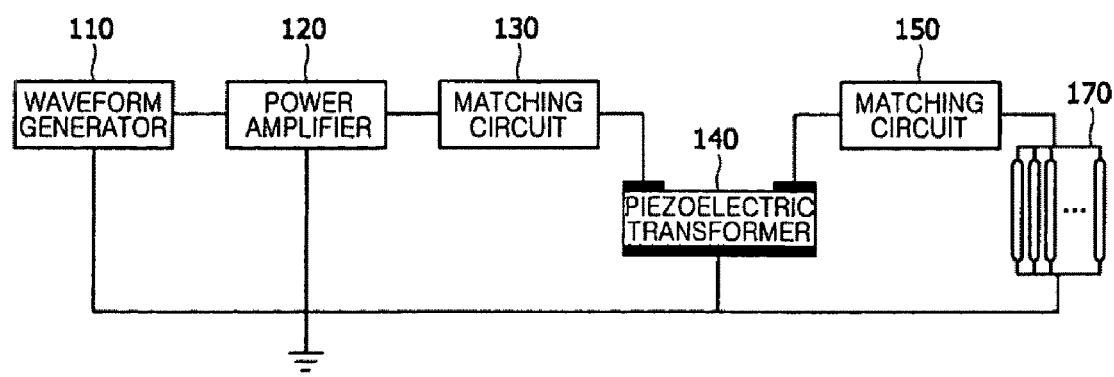
FIG. 16 is a block diagram showing the construction of a system using a piezoelectric transformer according to a second embodiment of the present invention.

FIG. 16 is a block diagram showing the construction of a system using the piezoelectric transformer of FIG. 3 according to a second embodiment of the present invention. The system of FIG. 16 includes a waveform generator 110, a power amplifier 120, an input side matching circuit 130, a piezoelectric transformer 140, an output side matching circuit 150, and EEFLs 170. The piezoelectric and dielectric characteristics of the ceramic piezoelectric element used in FIG. 16 are the same as those of the above case. A sine wave having an input voltage range from 0 to 130 Vrms is used in a driving unit, an input frequency, which is used in a maximum output mode, is used, and 10 6 W-level EEFLs are driven in parallel.

Figure 17:
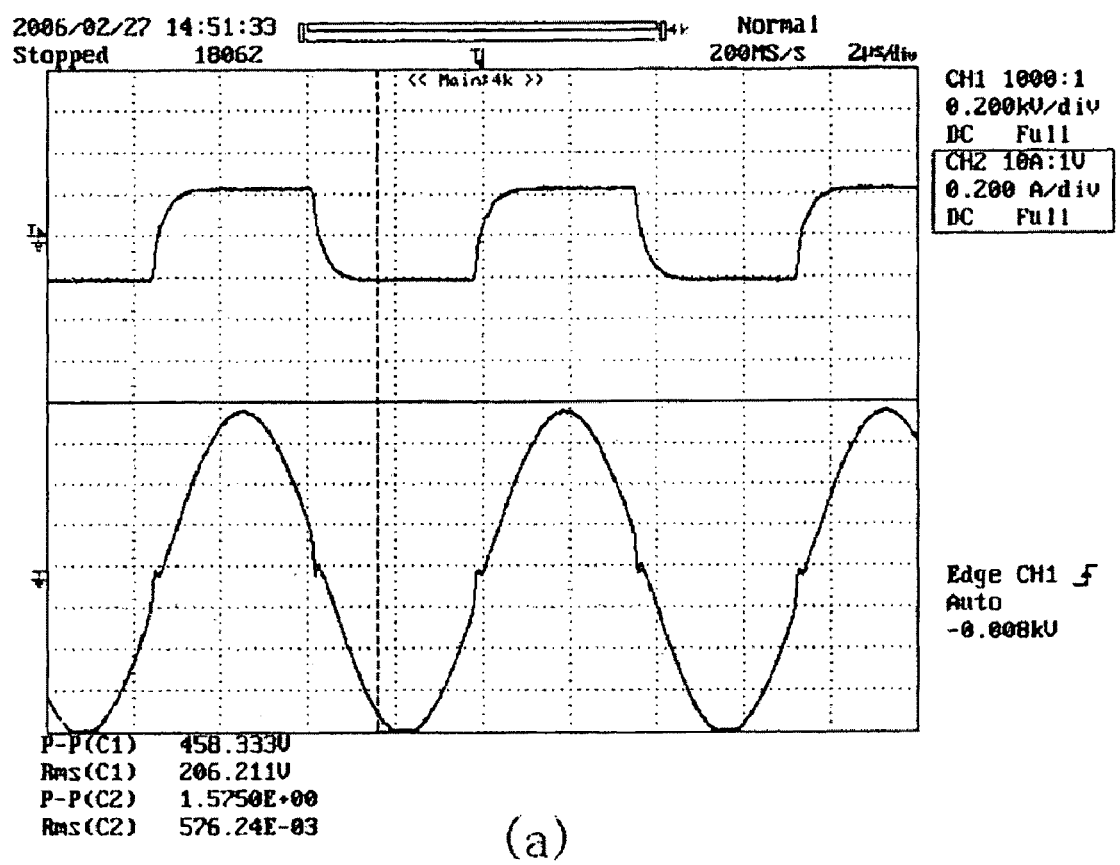
FIG. 17 is a graph showing voltages and currents on input and output sides obtained in an experiment according to a second embodiment of the present invention.
Figure 17:
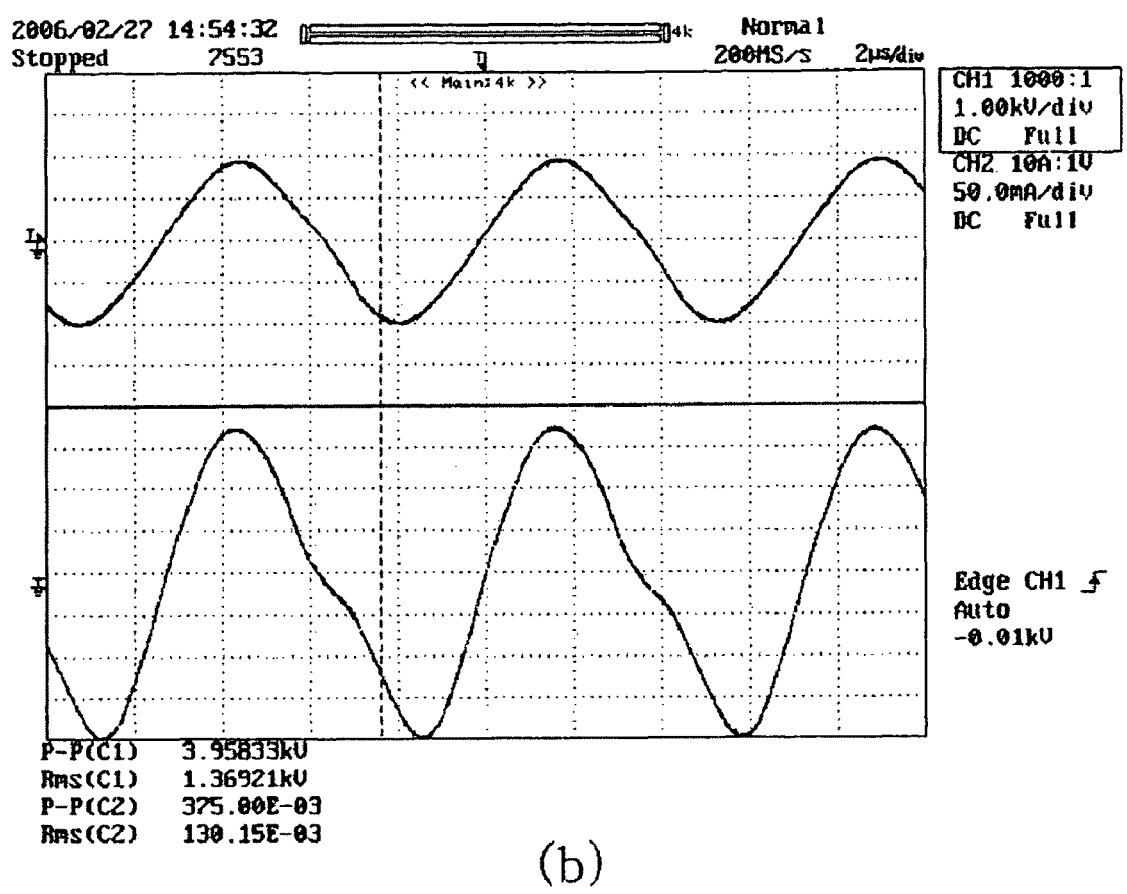

FIG. 17 illustrates graphs of voltages and currents on an input side and an output side in an experiment according to a second embodiment of the present invention. FIG. 17(a) illustrates the waveforms of voltage and current on the input side, and FIG. 17(b) illustrates the waveforms of voltage and current on the output side. In the graphs of FIG. 17, it should be noted that, in the case of a voltage waveform, a measured value must be read as a value obtained by multiplying 0.5 by the measured value, because the scale of a voltage probe is 500:1 and the scale of an oscilloscope is 1000:1. For example, a measured RMS input side voltage is 206.2 Vrms, but an actual voltage value is 103.1 Vrms, which is obtained by multiplying 0.5 by 206.2 Vrms.

Figure 18:
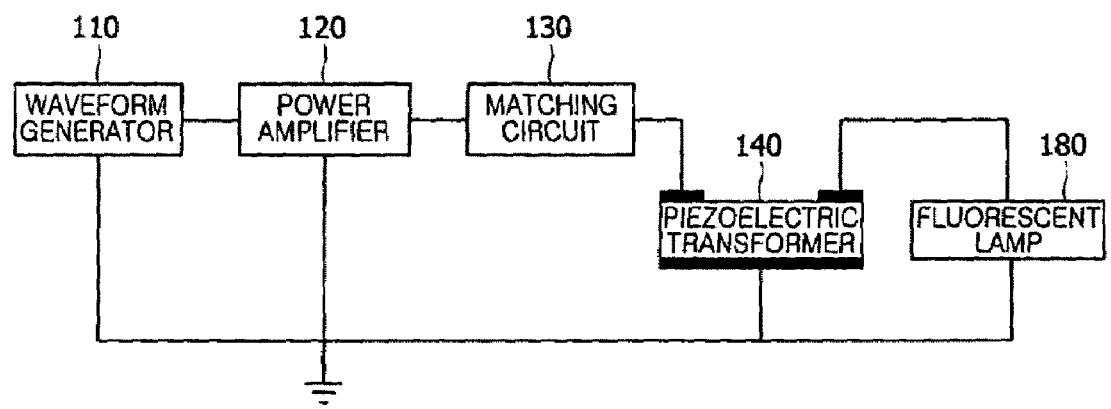
FIG. 18 is a block diagram showing the construction of a system using a piezoelectric transformer according to a third embodiment of the present invention.

FIG. 18 is a block diagram showing the construction of a system using the piezoelectric transformer of FIG. 3 according to a third embodiment of the present invention. The system of FIG. 18 includes a waveform generator 110, a power amplifier 120, an input side matching circuit 130, a piezoelectric transformer 140, and a fluorescent lamp 180. In FIG. 18, a 55 W-level fluorescent lamp is driven in parallel.

Figure 19:
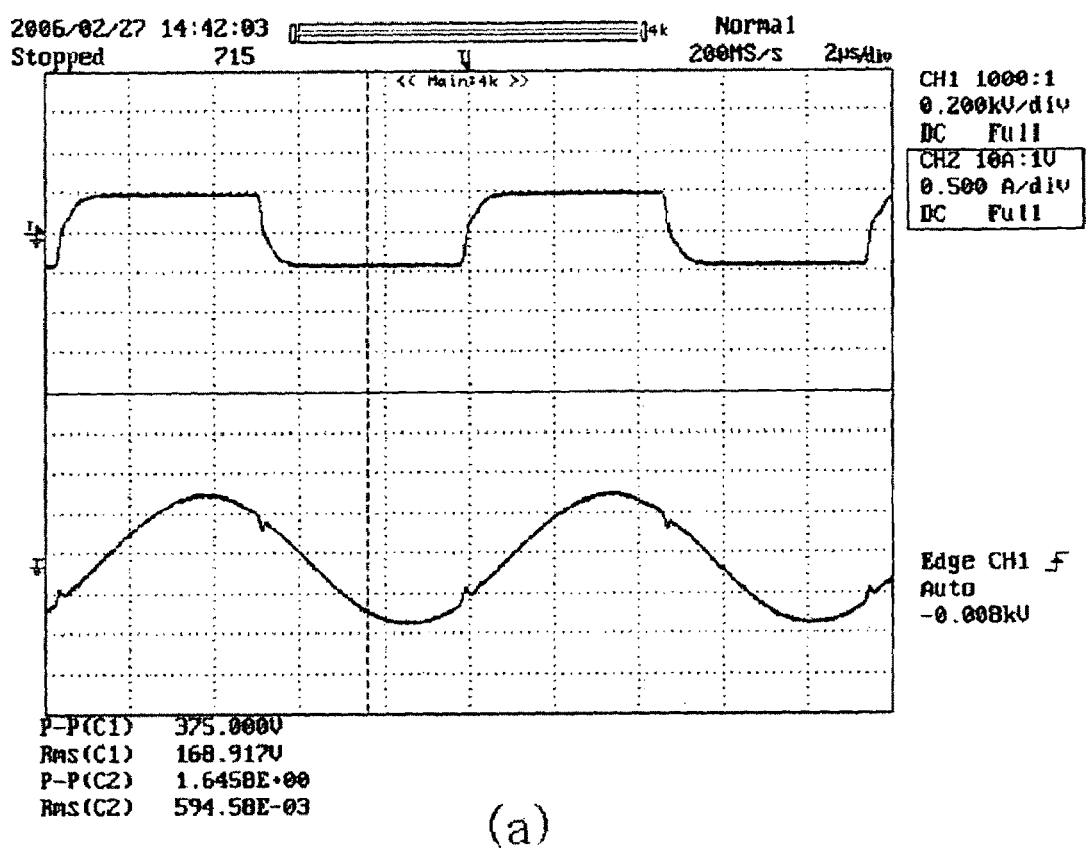
FIG. 19 is a graph showing voltages and currents on input and output sides, obtained in an experiment according to a third embodiment of the present invention.
Figure 19:
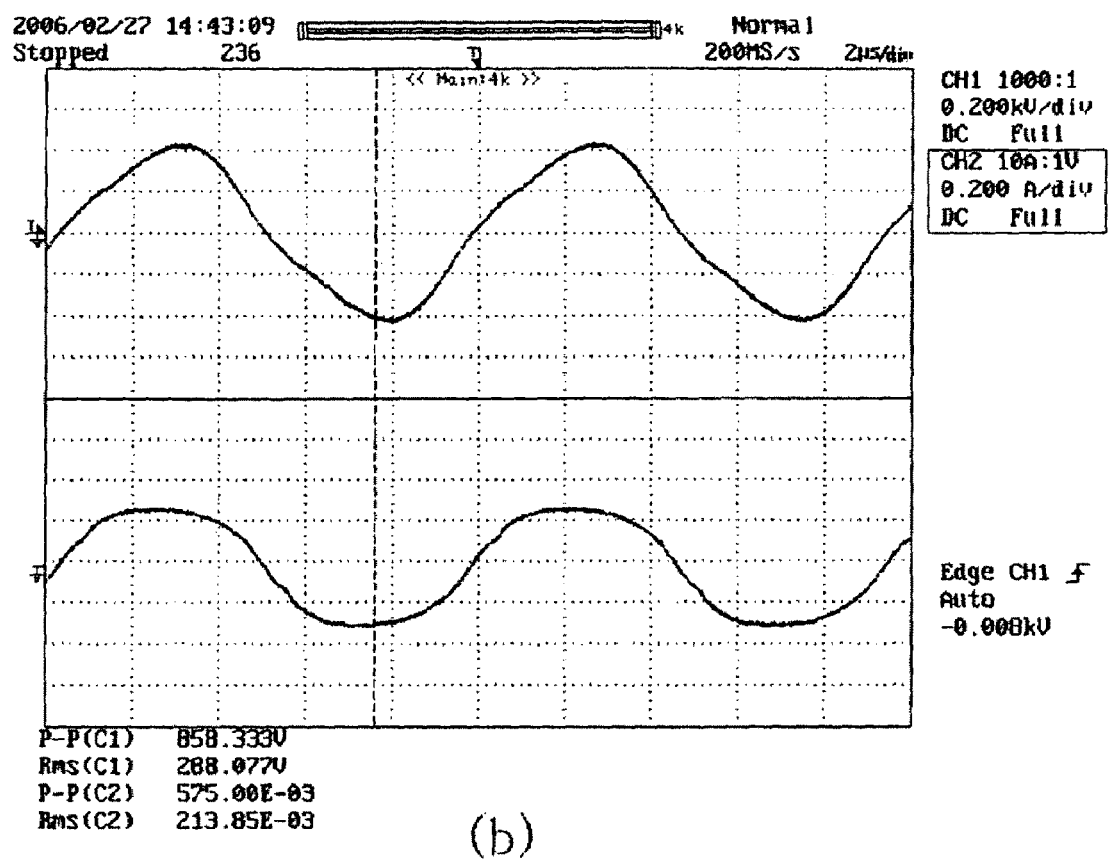

FIG. 19 illustrates graphs of voltages and currents on an input side and an output side in an experiment according to a third embodiment of the present invention. FIG. 19(a) illustrates the waveforms of voltage and current on the input side, and FIG. 19(b) illustrates the waveforms of voltage and current on the output side. In the graphs of FIG. 19, it should be noted that, in the case of a voltage waveform, a measured value must be read as a value obtained by multiplying 0.5 by the measured value because the scale of a voltage probe is 500:1 and the scale of an oscilloscope is 1000:1. For example, a measured RMS input side voltage is 168.9 Vrms, but an actual voltage value is 84.4 Vrms, which is obtained by multiplying 0.5 by 168.9 Vrms.

Figure 20:
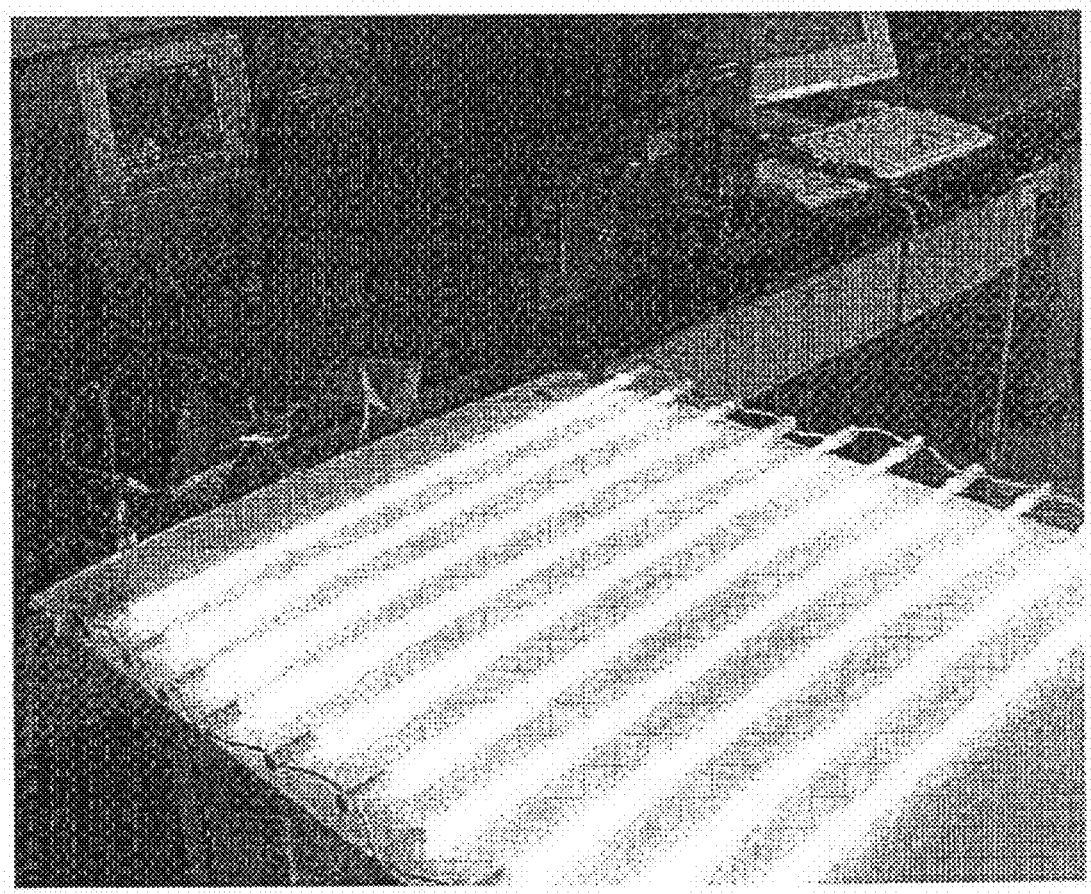
FIG. 20 is a view showing the actual picture of a situation in which an EEFL using a piezoelectric transformer is driven according to an embodiment of the present invention.

FIG. 20 is a view showing the actual picture of a situation in which an EEFL using a piezoelectric transformer is driven according to an embodiment of the present invention. In FIG. 20, a square wave of 145 kHz frequency is used as an input and 10 EEFLs are driven in parallel.

Although the present invention has been described using several preferred embodiments, these embodiments are only exemplary, and are not intended to limit the present invention. For example, in the above description, the case where the number of electrodes constituting a pinwheel shape is four is described as an example, but it is possible to realize variation, such as by setting the number of electrodes constituting a pinwheel shape to three, or to five or more. The direction of the pinwheel can be set either to a clockwise direction or to a counterclockwise direction. As described above, those skilled in the art will appreciate that various modifications, additions and substitutions are possible, without departing from the scope and spirit of the invention as disclosed in the accompanying claims. Further, the scope of the present invention is not limited to the above-described embodiments, and should be defined by the claims and equivalents thereof.

The invention claimed is:

1. A piezoelectric transformer, comprising:
a body made of a piezoelectric material;
upper electrodes formed on any one of first and second planes corresponding to upper and lower surfaces of the body, formed in a planar shape identical to that of the body, and formed to be separated in a shape of a pinwheel, the upper electrodes being implemented such that an input voltage is applied to some of the separate electrodes, and an output voltage is obtained from the remaining electrodes; and
a lower electrode formed on a plane opposite the plane on which the upper electrodes are formed, the lower electrode being implemented using an input/output common electrode.

2. A piezoelectric transformer, comprising:
a body made of a piezoelectric material;
upper electrodes formed on any one of first and second planes, corresponding to upper and lower surfaces of the body, formed in a planar shape identical to that of the body, and formed to be separated in a shape of a pinwheel, the upper electrodes being implemented such that an input voltage is applied to some of the separate electrodes, and an output voltage is obtained from the remaining electrodes; and
lower electrodes formed on a plane opposite the plane on which the upper electrode is formed, the lower electrodes being formed in a planar shape identical to that of the body and formed to be separated in a shape of a pinwheel, the lower electrodes being implemented such that an input voltage is applied to those electrodes corresponding to the some of the upper electrodes, to which the input voltage is applied, and an output voltage is obtained from the remaining electrodes.

3. The piezoelectric transformer according to claim 2, wherein the pinwheel shape of the lower electrodes is formed to be rotated at a predetermined angle with respect to the pinwheel shape of the upper electrodes.

4. The piezoelectric transformer according to claim 1 or 2, wherein the upper electrodes comprise a plurality of spiral wing-shaped electrodes, and an electrode formed in a portion other than the plurality of wing-shaped electrodes, the wing-shaped electrodes forming the pinwheel shape while being spaced apart from each other at regular intervals.

5. The piezoelectric transformer according to claim 4, wherein the input voltage is applied to the electrode, other than the wing-shaped electrodes, among the separate electrodes of the upper electrodes, and the output voltage is obtained from the plurality of wing-shaped electrodes.

6. The piezoelectric transformer according to claim 4, wherein the input voltage is applied to the wing-shaped electrodes, among the separate electrodes of the upper electrodes, and the output voltage is obtained from the electrode other than the wing-shaped electrodes.

7. The piezoelectric transformer according to claim 1 or 2, wherein the upper electrode is separated by a plurality of spiral insulating lines which radially outwardly extend spirally from an insulating region formed at a center of the upper electrode, thus forming the pinwheel shape.

8. The piezoelectric transformer according to claim 1 or 2, wherein the body has a polarization direction formed in a thicknesswise direction.

9. The piezoelectric transformer according to claim 1 or 2, wherein the pinwheel shape formed on the upper electrodes has a shape rotating counterclockwise.

10. The piezoelectric transformer according to claim 1 or 2, wherein the pinwheel shape formed on the upper electrodes has a shape rotating clockwise.

11. The piezoelectric transformer according to claim 1 or 2, wherein the body has the planes each formed in a circular shape.

12. The piezoelectric transformer according to claim 1 or 2, wherein the body has the planes each formed in a ring shape.

* * * * *